(12) United States Patent
Yoo

(10) Patent No.: US 10,772,230 B1
(45) Date of Patent: Sep. 8, 2020

(54) TEST BOARD

(71) Applicant: SK hynix Inc., Gyeonggi-do (KR)

(72) Inventor: Myung Seob Yoo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/688,219

(22) Filed: Nov. 19, 2019

(30) Foreign Application Priority Data

Apr. 22, 2019 (KR) .......................... 10-2019-0046909

(51) Int. Cl.
  *H05K 1/18* (2006.01)
  *H05K 7/14* (2006.01)
  *G06F 1/18* (2006.01)

(52) U.S. Cl.
  CPC ........... *H05K 7/1417* (2013.01); *G06F 1/183* (2013.01); *H05K 7/1488* (2013.01)

(58) Field of Classification Search
  CPC ..................... H05K 1/183–185; H05K 7/1417
  See application file for complete search history.

(56) References Cited

U.S. PATENT DOCUMENTS

| | | | | |
|---|---|---|---|---|
| 5,611,057 A * | 3/1997 | Pecone | .................... | G06F 1/184 361/784 |
| 6,414,505 B1 * | 7/2002 | Stauffer | .................. | G06F 1/184 324/756.05 |
| 6,639,806 B1 * | 10/2003 | Chuang | ................... | G06F 1/184 361/748 |
| 7,233,499 B2 | 6/2007 | Yu et al. | | |
| 10,481,194 B2 * | 11/2019 | George | .............. | G01R 31/2834 |
| 2002/0125879 A1 * | 9/2002 | Lee | ......................... | G11C 29/56 324/756.05 |
| 2004/0009708 A1 * | 1/2004 | Gochnour | .............. | H01R 31/06 439/638 |
| 2005/0086413 A1 * | 4/2005 | Lee | ..................... | G06K 19/077 710/313 |

(Continued)

FOREIGN PATENT DOCUMENTS

| KR | 10-1999-0058717 | 7/1999 |
|---|---|---|
| KR | 10-2007-0025994 | 3/2007 |

(Continued)

OTHER PUBLICATIONS 16.0 GT/s Calibration Channel Reference Design, PCI Express Base Specification, Revision 4.0, Version 1.0., Sep. 27, 2017, pp. 1047.

*Primary Examiner* — Hoa C Nguyen
(74) *Attorney, Agent, or Firm* — IP & T Group LLP

(57) ABSTRACT

The present disclosure relates to an electronic device. A test board having improved reliability according to the present disclosure includes a main board, a storage device connector positioned at an upper section of the main board and configured to vertically combine the main board and a storage device with each other, an analysis signal output terminal positioned at the upper section of the main board and configured to output an analysis signal for testing the storage device or communication between the storage device and a host, a host connector connected to a first side section of the main board and configured to combine the main board and the host with each other; and a first sub board detachably connected to a second side section of the main board.

16 Claims, 6 Drawing Sheets

(56) References Cited

U.S. PATENT DOCUMENTS

| | | | |
|---|---|---|---|
| 2009/0302876 A1* | 12/2009 | Koizumi | G01R 31/2863 324/756.07 |
| 2014/0082418 A1* | 3/2014 | Kim | G06F 11/2733 714/27 |
| 2015/0016172 A1* | 1/2015 | Loh | G11C 5/02 365/51 |
| 2016/0124822 A1* | 5/2016 | Remple | G06F 11/263 714/30 |

FOREIGN PATENT DOCUMENTS

| | | |
|---|---|---|
| KR | 10-2007-0050592 | 5/2007 |
| KR | 10-0729027 | 6/2007 |

\* cited by examiner

TEST BOARD

CROSS-REFERENCE TO RELATED APPLICATION

The present application claims priority under 35 U.S.C. § 119(a) to Korean patent application number 10-2019-0046909 filed on Apr. 22, 2019, which is incorporated herein by reference in its entirety.

BACKGROUND

1. Field of Invention

The present disclosure relates to a test substrate, and more particularly, the present disclosure relates to a test board that is capable of being vertically combined with a storage device.

2. Description of Related Art

A storage device is a device that stores data under control of a host device such as a computer or a smartphone. A storage device may include a memory device in which data is stored and a memory controller controlling the memory device. The memory device may be divided into a volatile memory device and a non-volatile memory device.

The volatile memory device is a device that stores data only when power is supplied and loses the stored data when the power supply is cut off. The volatile memory device may include a static random access memory (SRAM), a dynamic random access memory (DRAM), and the like.

The non-volatile memory device is a device that does not lose data even when power is off. The non-volatile memory device may include read only memory (ROM), a programmable ROM (PROM), an electrically programmable ROM (EPROM), an electrically erasable and programmable ROM (EEPROM), a flash memory, and the like.

SUMMARY

An embodiment of the disclosure provides a test board having improved reliability.

A test board according to an embodiment of the present disclosure includes a main board, a storage device connector, an analysis signal output terminal, a host connector, and a first sub board. The storage device connector is positioned at an upper section of the main board and is configured to vertically combine the main board and a storage device with each other. The analysis signal output terminal is positioned at the upper section of the main board and is configured to output an analysis signal for testing the storage device or communication between the storage device and a host. The host connector is connected to a first side section of the main board and is configured to combine the main board and the host with each other. The first sub board is detachably connected to a second side section of the main board.

A test board according to an embodiment of the present disclosure includes a main board, a storage device connector, an analysis signal output terminal, a host connector, and one or more sub boards. The storage device connector is provided on an upper section of the main board to vertically couple the main board to a storage device. The host connector is provided on a first side section of the main board to horizontally couple the main board to a host. The analysis signal output terminal is provided on the upper section of the main board to output a signal transferred to or from the storage device connector when the storage device is coupled to the storage device connector. The one or more sub boards each coupled, in series, to each other and to a second side section of the main board. Wherein the sub boards are coupled to be selectively detached according to a form factor of the storage device.

DETAILED DESCRIPTION

Figure 1:
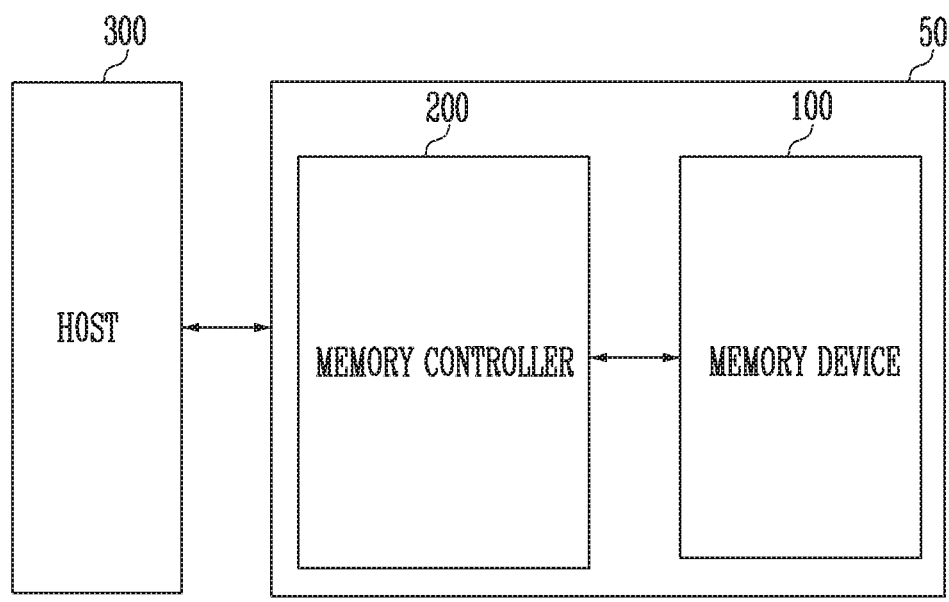
FIG. 1 is a diagram describing a storage device.

FIG. 1 is a diagram describing a storage device.

Referring to FIG. 1, the storage device 50 may include a memory device 100 and a memory controller 200 controlling an operation of the memory device 100. The storage device 50 is a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured by any one of various types of packages. For example, the storage device 50 may be manufactured by any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data.

Each of the memory cells may be configured as a single level cell (SLC) that stores one data bit, a multi-level cell (MLC) that stores two data bits, a triple level cell (TLC) that stores three data bits, or a quad level cell (QLC) that stores four data bits.

The memory cell array may include a plurality of memory blocks. Each of the memory blocks may include a plurality of memory cells. One memory block may include a plurality of pages. In an embodiment, a page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). For convenience of description, it is assumed that the memory device 100 is a NAND flash memory.

The memory device 100 is configured to receive a command and an address from the memory controller 200 and access an area selected by the address in the memory cell array. That is, the memory device 100 may perform an operation that is the command on the area selected by the address. For example, the memory device 100 may perform a write operation (program operation), a read operation, and an erase operation. During the program operation, the memory device 100 may program the area selected by the address with data. During the read operation, the memory device 100 may read data from the area selected by the address. During the erase operation, the memory device 100 may erase data from the area selected by the address.

The memory controller 200 may control overall operations of the storage device 50.

When power is applied to the storage device 50, the memory controller 200 may execute firmware FW. When the memory device 100 is a flash memory device, the memory controller 200 may operate firmware such as a flash translation layer (FTL) for controlling communication between the host 300 and the memory device 100.

In an embodiment, the memory controller 200 may receive data and a logical block address (LBA) from the host 300 and convert the logical block address LBA into a physical block address (PBA) indicating an address of memory cells in which data included in the memory device 100 is to be stored.

The memory controller 200 may control the memory device 100 so that the program operation, the read operation or the erase operation may be performed in response to a request from the host 300. During the program operation, the memory controller 200 may provide a program command, a physical block address, and data to the memory device 100. During the read operation, the memory controller 200 may provide a read command and a physical block address to the memory device 100. During the erase operation, the memory controller 200 may provide an erase command and a physical block address to the memory device 100.

In an embodiment, the memory controller 200 may generate and transfer a program command, an address, and data to the memory device 100 regardless of a request from the host 300. For example, the memory controller 200 may provide a command, an address, and data to the memory device 100 to perform background operations such as a program operation for wear leveling and a program operation for garbage collection.

In an embodiment, the memory controller 200 may control at least two memory devices 100. In this case, the memory controller 200 may control the memory devices 100 according to an interleaving scheme so as to improve operation performance. The interleaving scheme may be an operation scheme for overlapping operating periods of at least two memory devices 100.

The host 300 may communicate with the storage device 50 using at least one of various communication methods such as universal serial bus (USB), serial AT attachment (SATA), serial attached SCSI (SAS), high speed intership (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM).

Figure 2:
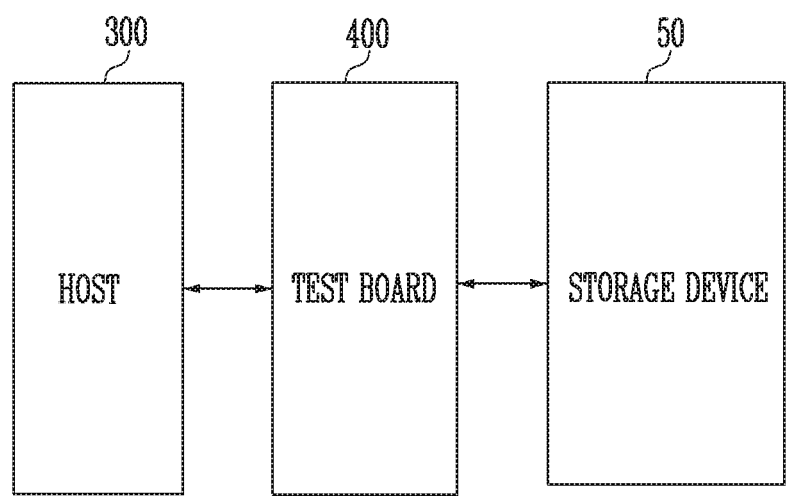
FIG. 2 is a diagram describing a test board according to an embodiment of the present disclosure.

FIG. 2 is a diagram for describing a test board according to an embodiment of the present disclosure.

Referring to FIG. 2, the test board 400 may be connected between the host device 300 and the storage device 50 described with reference to FIG. 1. The test board 400 may serve as a bridge in the connection between the storage device 50 and the host 300. That is, the storage device 50 and the host 300 are electrically connected to each other through the test board 400.

The test board 400 may include a host connector that connects the test board 400 and the host 300 with each other. The test board 400 may include a storage device connector that connects the test board 400 and the storage device 50 with each other. In an embodiment, the test board 400 may be vertically combined with the storage device 50 through the storage device connector.

In an embodiment, the test board 400 may include a main board and a plurality of sub boards.

The main board may be connected to the host connector and the storage device connector. Specifically, the host connector may be positioned on a first side section of the main board. The storage device connector may be positioned at an upper section of the main board.

The main board may be detachably connected to one sub board. One sub board may be detachably connected to another sub board. Each sub board may be selectively separated according to a form factor (a physical feature) of the storage device 50 connected to the test board 400. Therefore, a size of the test board 400 may be variably controlled according to the form factor (a physical feature) of the storage device 50. The test board 400 controlled to be the same form factor as the storage device 50 may be connected to a connection portion of the host 300 instead of the storage device 50. In an embodiment, sizes of each sub boards may be different. In another embodiment, the sizes of each sub board may be the same.

Each of the main board and the plurality of sub boards may include a ground terminal. The main board may be combined with the host 300 through any one of the ground terminals of each board.

For example, when a first sub board connected to the main board is separated from the main board, the main board may be combined with the host 300 through the ground terminal of the main board. When a second sub board connected to the first sub board is separated from the first sub board, the main board may be combined with the host 300 through the ground terminal of the first sub board.

The ground terminal when combined with the host may reduce noise of an analysis signal output from an analysis signal output terminal. For example, the ground terminal may be combined with the host to reduce electromagnetic interference (EMI) or radio frequency (RF) noise.

The test board 400 may include the analysis signal output terminal connected to the main board. The analysis signal output terminal may be positioned at the upper section of the main board. The analysis signal output terminal may output an analysis signal for testing the storage device or communication between the storage device and the host.

The analysis signal may include a signal transferred between the host and the storage device, a communication signal between a physical layer of the host and a physical layer of the storage device, a signal for measuring power consumption of the storage device, an asynchronous communication (UART) signal between the host and the storage device, a signal for failure analysis, and the like.

The analysis signal output terminal may include a plurality of output terminals respectively connected to connection lines that connect the storage device connector and the host connector to each other. The analysis signal output terminal may output, through the plurality of output terminals, the analysis signal transmitted through the connection lines between the storage device and the host.

The analysis signal output terminal may be configured to output the analysis signal within a predetermined target range even though the storage device 50 and the host 300 are connected with each other through the test board 400. This is similar to a case where the storage device 50 and the host 300 are directly connected with each other.

Figure 3:
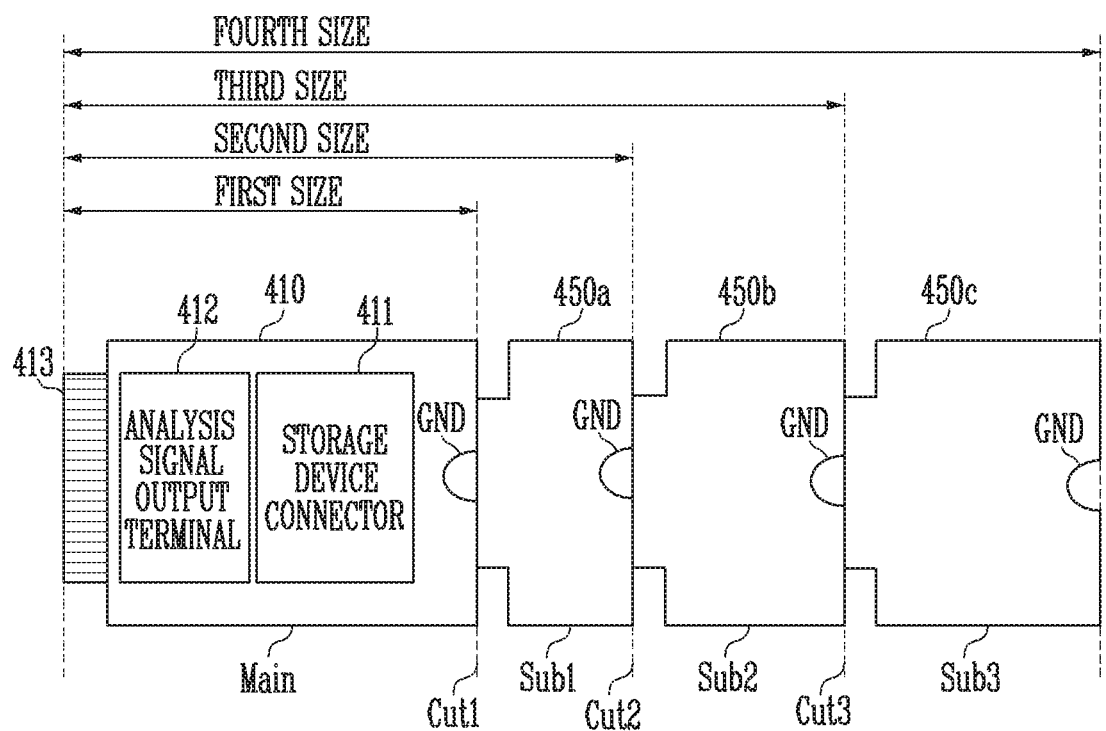
FIG. 3 is a diagram describing a structure of the test board of FIG. 2.

FIG. 3 is a diagram describing a structure of the test board of FIG. 2.

Referring to FIG. 3, the test board 400 may include a main board 410 and first to third sub boards 450a to 450c. The main board 410 may be connected to the first to third sub boards 450a to 450c in series. The number of sub boards connected to the main board 410 is not limited to the present embodiment.

A side section of the main board 410 and the first to third sub boards 450a to 450c may be detachably connected to a side section of the other substrate. For example, the main board 410 may be detachably connected to the first sub board 450a. The second sub board 450b may be detachably connected to the first sub board 450a. The third sub board 450c may be detachably connected to the second sub board 450b.

Sizes of each of the first to third sub boards 450a to 450c may be different. In various embodiments, the sizes of each of the first to third sub boards 450a to 450c may be the same.

Each sub board 450 may be selectively separated according to the form factor (the physical feature) of the storage device connected to the main board 410. Therefore, the size of the test board 400 may be variably controlled according to the form factor (the physical feature) of the storage device.

For example, when the physical feature of the storage device is a first size, the first sub board 450a may be separate from the main board 410. When the physical feature of the storage device is a second size, the second sub board 450b may be separated from the first sub board 450a. When the physical feature of the storage device is a third size, the third sub board 450c may be separated from the second sub board 450b. When the physical feature of the storage device is a fourth size, the first to third sub boards 450a to 450c may be connected to the main board 410 in series.

The main board 410, which is controlled to be the same form factor as the storage device, may be connected to the connection portion of the host instead of the storage device.

In an embodiment, the main board 410 and each of the first to third sub boards 450a to 450c may include a ground terminal GND. The main board 410 may include a main ground terminal GND. The first sub board 450a may include a first ground terminal GND. The second sub board 450b may include a second ground terminal GND. The third sub board 450c may include a third ground terminal GND.

The main board 410 may be combined with the host through any one ground terminal of the main ground terminal and the first to third ground terminals GND.

For example, when the first sub board 450a is separated from the main board 410, the main board 410 may be combined with the host through the main ground terminal GND. When the second sub board 450b is separated from the first sub board 450a, the main board 410 may be combined with the host through the first ground terminal GND. When the third sub board 450c is separated from the second sub board 450b, the main board 410 may be combined with the host through the second ground terminal GND. When the main board 410 is connected to the first to third sub boards 450a to 450c, the main board 410 may be combined with the host through the third ground terminal GND.

The ground terminal GND when combined with the host may reduce the noise of the analysis signal output from the analysis signal output terminal 412. For example, the ground terminal GNB may be combined with the host to reduce electromagnetic interference (EMI) or radio frequency (RF) noise.

The main board 410 may be connected to a storage device connector 411, an analysis signal output terminal 412, and a host connector 413. Specifically, the host connector 413 may be positioned on a first side section of the main board 410. The storage device connector 411 and the analysis signal output terminal 412 may be positioned at an upper section of the main board 410.

The storage device connector 411 may vertically combine the main board 410 with the storage device described with reference to FIG.

The analysis signal output terminal 412 may output an analysis signal for testing the storage device and the communication between the storage device and the host.

The analysis signal may include a signal transferred between the host and the storage device, a communication signal between a physical layer of the host and a physical layer of the storage device, a signal for measuring power consumption of the storage device, an asynchronous communication (UART) signal between the host and the storage device, a signal for failure analysis, and the like.

The analysis signal output terminal 412 may include a plurality of output terminals respectively connected to connection lines that connect the storage device connector 411 and the host connector 413 to each other. The analysis signal output terminal may output, through the plurality of output terminals, the analysis signal transmitted through the connection lines between the storage device and the host.

The output terminals may be configured in various forms. In an embodiment, the output terminal may be configured in a form of a pin. In another embodiment, the output terminal may be configured in a form of a hole for inserting a pin.

The analysis signal output terminal 412 may be configured to output the analysis signal within a predetermined target range even though the storage device is connected to the host through the main board 410. This is similar to a case where the storage device and the host are directly connected with each other.

The target may be a characteristic of the output analytical signal. For example, the target may be a voltage level of the analysis signal, a current level, a signal strength, a response time, a frequency band, and the like. The analysis signal output terminal may include a circuit for preventing power drop or signal loss of the analysis signal.

The host connector 413 may combine the host and the main board 410 with each other described with reference to FIG. 1.

Figure 4:
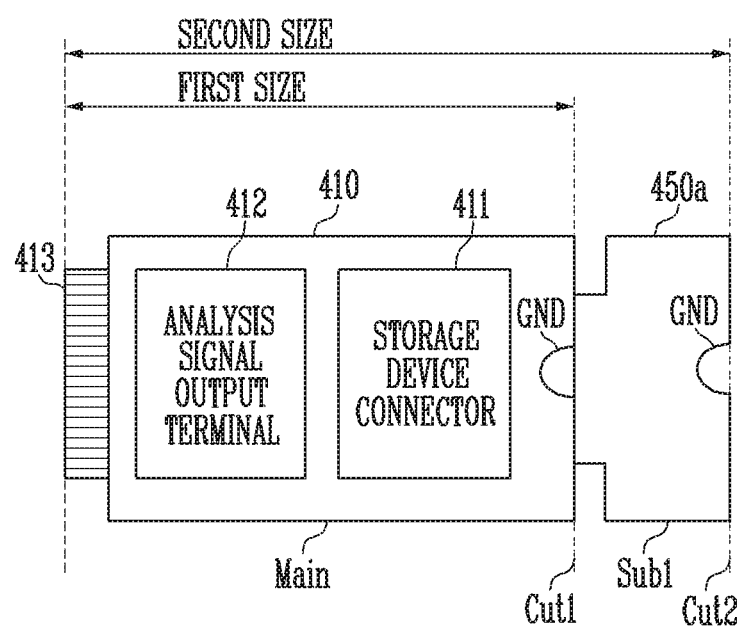
FIG. 4 is a diagram describing a structure of a selectively separated test board according to an embodiment of the present disclosure.

FIG. 4 is a diagram describing a structure of a selectively separated test board according to an embodiment of the present disclosure.

Referring to FIG. 4, the test board 400 may include the main board 410 and a first sub board 450a.

The main board 410 and the sub boards 450a to 450c described with reference to FIG. 3 may be selectively separated according to the physical feature of the storage device combined to the storage device connector 411. The physical feature of the storage device combined to the storage device connector 411 may be of a second size. Therefore, the test board 400 of FIG. 4 may be a test board on which the second sub board 450b is physically separated from the first sub board 450a in the test board 400 of FIG. 3. That is, the previously detachably connected first and second sub boards 450a 450b are separated from each other.

The main board 410 of the test board 400 may be combined to the host described with reference to FIG. 3 through the ground terminal GND of the first sub board 450a connected to the main board 410. For example, the ground terminal GND of the first sub board 450a and the host may be connected with each other through a combining means. The combining means may be variously configured as a screw, a bolt, a nut, and the like.

When the main board 410 is combined with the host through the ground terminal GND of the first sub board 450a, the noise of the analysis signal output from the analysis signal output terminal 412 may be reduced.

Figure 5:
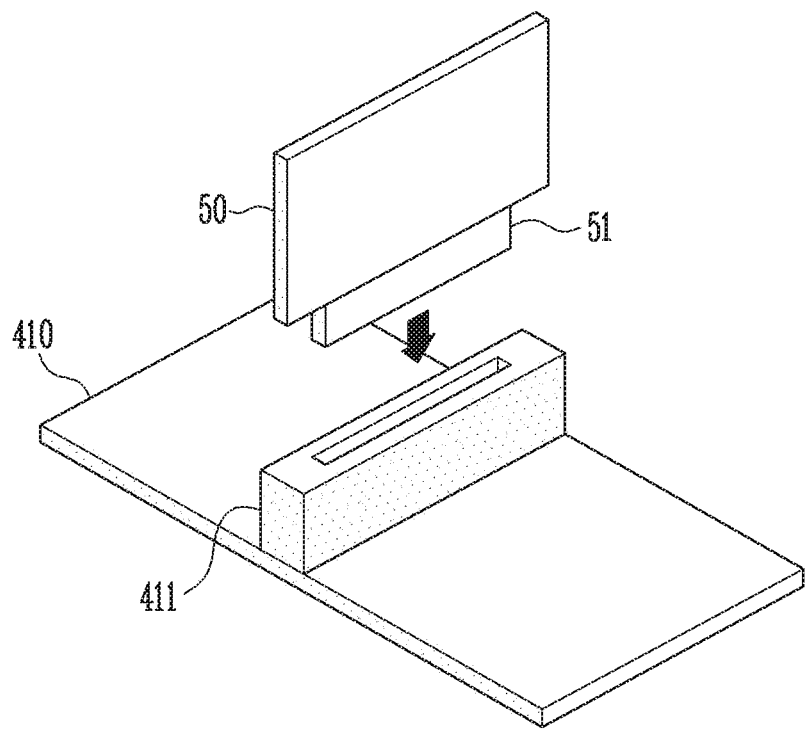
FIG. 5 is a diagram describing a combining operation of the storage device and the test board.

FIG. 5 is a diagram describing a combining operation of the storage device and the test board.

Referring to FIG. 5, the storage device connector 411 may be positioned at the upper section of the main board 410 included in the test board. The storage device connector 411 may have a configuration for accepting a storage device combining portion 51.

The storage device 50 may include the storage device combining portion 51 having the same form factor as the storage device connector 411. The storage device combining portion 51 may have a configuration for being inserted into the storage device connector 411.

The storage device combining portion 51 may be vertically inserted into the storage device connector 411. The storage device 50 may be combined perpendicularly to the test board through the storage device connector 411 at the upper section of the main board 410.

In various embodiments, the storage device connector 411 may have a configuration for accepting the storage device combining portion 51. The storage device combining portion 51 may have a configuration for being inserted into the storage device connector 411.

Figure 6:
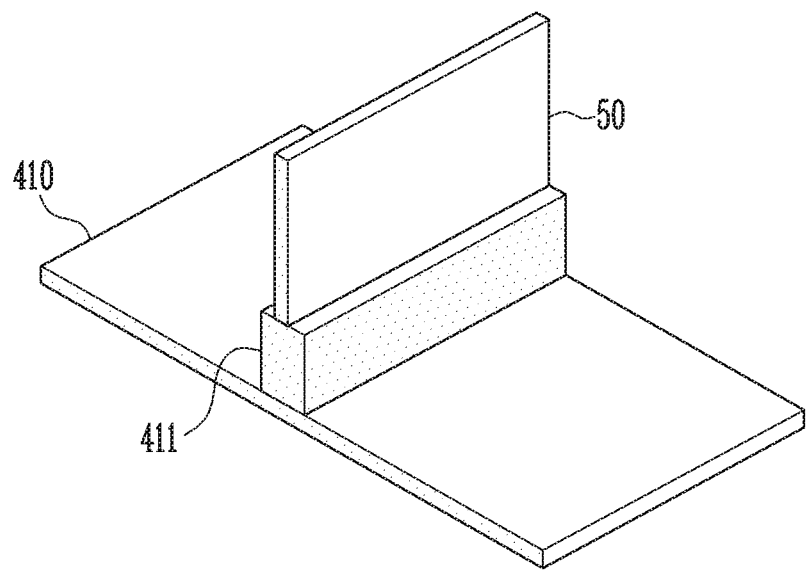
FIG. 6 is a perspective view of the test board connected to the storage device.

FIG. 6 is a perspective view of the test board combined with the storage device.

Referring to FIG. 6, the storage device 50 may be vertically combined with the test board including the main board 410. The storage device 50 is combined with the main board 410 through the storage device connector 411, and thus the signal transferred from and to the host 50 described with reference to FIG. 3 may be transferred through the main board 410.

Figure 7:
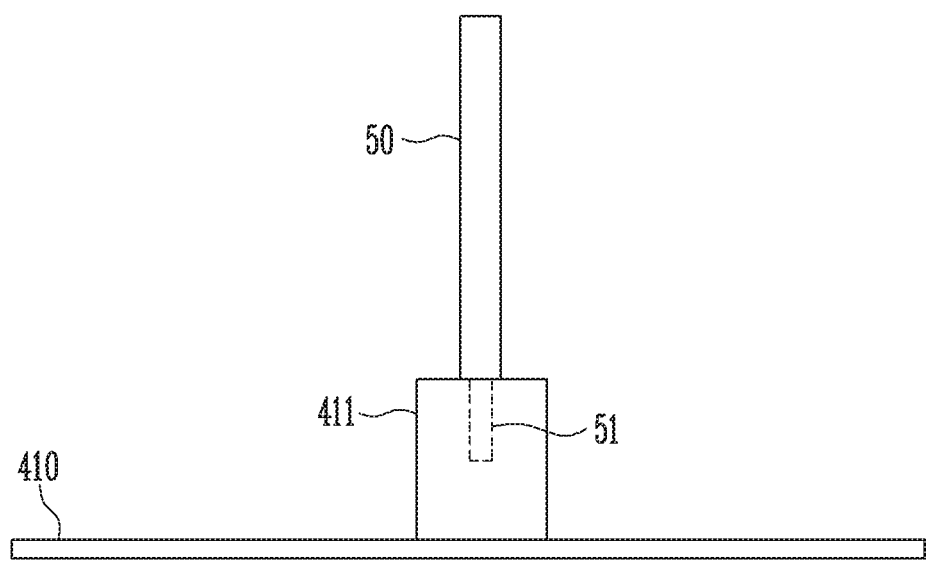
FIG. 7 is a side view of the test board connected to the storage device.

FIG. 7 is a side view of the test board combined to the storage device.

Referring to FIG. 7, the storage device connector 411 may be positioned at the upper section of the main board 410. The storage device combining portion 51 may be inserted into the storage device connector 411. Therefore, the storage device 50 may be vertically combined with the test board including the main board 410.

Figure 8:
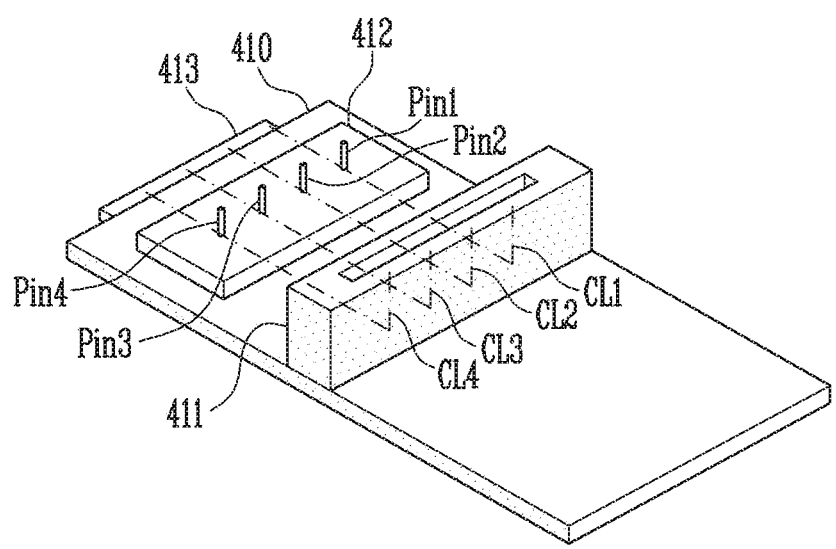
FIG. 8 is a perspective view of an analysis signal output terminal of FIG. 4.

FIG. 8 is a perspective view of the analysis signal output terminal of FIG. 4.

Referring to FIG. 8, the analysis signal output terminal 412 may be connected to a plurality of connection lines CL1 to CL4 that connect the storage device connector 411 and the host connector 413 to each other. The analysis signal output terminal 412 may include a plurality of output terminals respectively connected to the connection lines CL1 to CL4. In FIG. 8, the plurality of output terminals may be a plurality of pins Pin1 to Pin4. The output terminal may be configured in various forms.

The analysis signal output terminal 412 may output, through the plurality of pins Pin1 to Pin4, the analysis signal transmitted between the storage device and the host through the connection lines CL1 to CL4. For example, a signal transmitted through the first connection line CL1 between the storage device connector 411 and the host connector 413 may be output to the outside through the first pin Pin1. A signal transmitted through the second connection line CL2 between the storage device connector 411 and the host connector 413 may be output to the outside through the second pin Pin2. A signal transmitted through the third connection line CL3 between the storage device connector 411 and the host connector 413 may be output to the outside through the third pin Pin1. A signal transmitted through the fourth connection line CL4 between the storage device connector 411 and the host connector 413 may be output to the outside through the fourth pin Pin4.

The analysis signal output terminal 412 may be configured to output the analysis signal within a predetermined target range similarly to a case where the storage device 50 and the host 300 are directly connected to each other, even though the storage device 50 and the host 300 are connected to other through the main board 410.

The analysis signal may include a signal transferred between the host and the storage device, a communication signal between a physical layer of the host and a physical layer of the storage device, a signal for measuring power consumption of the storage device, an asynchronous communication (UART) signal between the host and the storage device, a signal for failure analysis, and the like.

The target may be a characteristic of the output analytical signal. For example, the target may be a voltage level of the analysis signal, a current level, a signal strength, a response time, a frequency band, and the like.

The analysis signal output terminal 412 may include a circuit for preventing power drop or signal loss of the analysis signal. Therefore, the analysis signal output terminal 412 may output the analysis signal within the target range even though an external device is connected to the first to fourth pins Pin1 to Pin4 and thus an internal impedance is changed.

Figure 9:
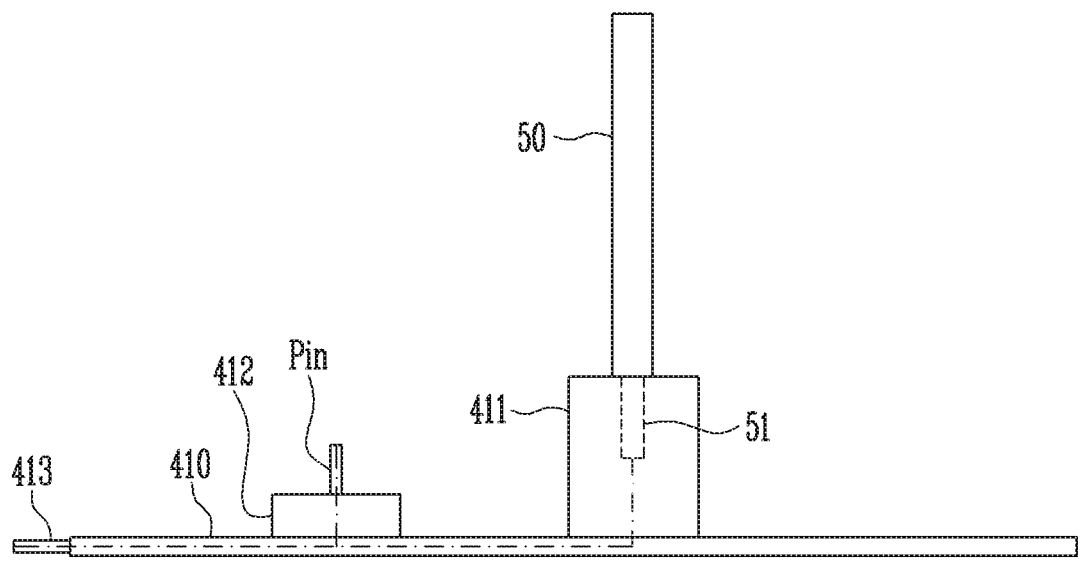
FIG. 9 is a side view of the analysis signal output terminal of FIG. 4.

FIG. 9 is a side view of the analysis signal output terminal of FIG. 4.

Referring to FIG. 9, the storage device connector 411 may be positioned at the upper section of the main board 410.

The analysis signal output terminal 412 may be positioned at the upper section of the main board 410. The analysis signal output terminal 412 may include an output terminal for outputting the analysis signal to the outside. In an embodiment, the output terminal may have a structure of a pin.

The pin may be connected to a connection line. The connection line may be a path for transferring a signal between the storage device connector 411, which is vertically combined with the storage device 50, and the host connector 413. The storage device combining portion 51 described with reference to FIG. 5 may be combined with the storage device connector 411 when inserted into the storage device connector 411.

The host connector 413 may be connected to a side section of the main board 410.

Figure 10:
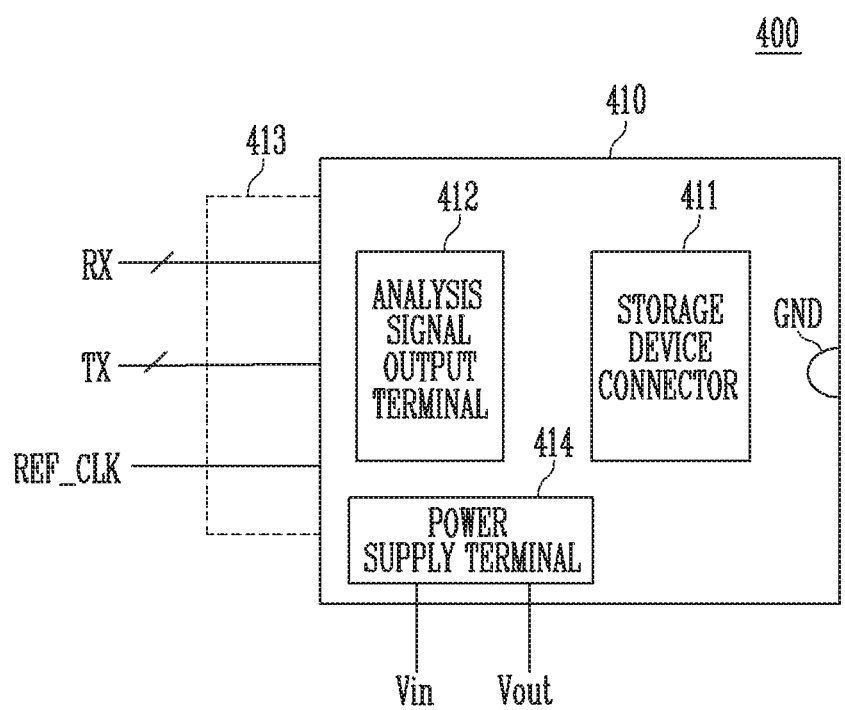
FIG. 10 is a diagram describing a characteristic of the test board of FIG. 2.

FIG. 10 is a diagram describing a characteristic of the test board of FIG. 2.

Referring to FIG. 10, the test board 400 may include the main board 410, the storage device connector 411, the analysis signal output terminal 412, the host connector 413, and a power supply terminal 414.

The storage device connector 411, the analysis signal output terminal 412, and the power supply terminal 414 may be positioned at the upper section of the main board 410. The host connector 413 may be connected to first side section of the main board 410.

The host connector 413 may include lines through which signals are transferred between the host and the storage device. Reception lines Rx may transfer the signal from the host to the storage device through the storage device connector 411. Transmission lines TX may transfer a signal from the storage device to the host through the storage device connector 411. A clock signal REF_CLK may be a reference clock for analyzing an operation of the storage device.

The power supply terminal 414 may receive power Vin from the outside and output internal power Vout for the operation of the storage device and an operation of the analysis signal output terminal.

In an embodiment, the power Vin input from the outside may be 3.3 V. In the internal power Vout output by the power supply terminal 414, a voltage drop about 0.2% compared to the input power Vin may occur. Therefore, the test board 400 may satisfy a power integrity characteristic in a test operation.

A ratio of the signal transmitted through the transmission lines TX to the signal transmitted through the reception lines RX may be defined as a scattering (S) parameter. An insertion loss may be expressed in decibel (dB) units at a specific frequency of the signal. For example, a low-loss base board may have an insertion loss of −4 dB to −11.5 dB at a certain frequency. A mid-loss base board may have an insertion loss of −12 dB to −19.5 dB at a certain frequency. A high-loss base board may have an insertion loss of −20 dB to −27.5 dB at a specific frequency.

The specific frequency may be 8 gigahertz (GHz). The bandwidth of the insertion loss and the value of the specific frequency of each substrate are not limited to the present embodiment.

In an embodiment, the test board 400 connected to the storage device through the storage device connector 411 may have an insertion loss of about −6 dB to −10 dB in a range of about 6 GHz to 8 GHz.

In various embodiments, the test board 400 may have an insertion loss of about −6 dB at about 7.5 GHz. Therefore, the test board 400 is a low-loss board and may satisfy the signal integrity characteristic.

Time domain reflectometry (TDR) may indicate an impedance value reflected/responded from a transmission line through which a signal is transmitted. When considering the TDR, the TDR of the storage device, the storage device connector 411, and the test board 400 may have about 80 ohms to 85 ohms. The values of the TDR of the test board 400 and the storage device connector 411 are not limited to the present embodiment.

What is claimed is:

1. A test board comprising:
a main board;
a storage device connector positioned at an upper section of the main board and configured to vertically combine the main board and a storage device with each other;
an analysis signal output terminal positioned at the upper section of the main board and configured to output an analysis signal for testing the storage device or communication between the storage device and a host;
a host connector connected to a first side section of the main board and configured to combine the main board and the host with each other; and
a first sub board detachably connected to a second side section of the main board.

2. The test board of claim 1, further comprising:
a second sub board detachably connected to a first side section of the first sub board.

3. The test board of claim 2, wherein the first sub board is coupled to be selectively separated from the main board according to a physical size corresponding to the storage device.

4. The test board of claim 2, wherein the second sub board is coupled to be selectively separated from the first sub board according to a physical size corresponding to the storage device.

5. The test board of claim 2, wherein the first sub board and the second sub board have different sizes.

6. The test board of claim 2, wherein the main board includes a main ground terminal, the first sub board includes a first ground terminal, and the second sub board includes a second ground terminal.

7. The test board of claim 6, wherein the main board is combined with the host through any one ground terminal of the main ground terminal, the first ground terminal, and the second ground terminal to reduce an electrical noise of the analysis signal.

8. The test board of claim 7, wherein the main board is combined with the host through the second ground terminal when the main board and the first and second sub boards are connected to one another in series.

9. The test board of claim 7, wherein the main board is combined with the host through the main ground terminal when the first sub board is separated from the main board.

10. The test board of claim 7, wherein the main board is combined with the host through the first ground terminal when the second sub board is separated from the first sub board.

11. The test board of claim 2, wherein the analysis signal includes at least one of a signal transferred between the host and the storage device, a communication signal between a physical layer of the host and a physical layer of the storage device, a signal for measuring power consumption of the storage device, an asynchronous communication signal between the host and the storage device.

12. The test board of claim 2, wherein the analysis signal output terminal includes a plurality of output terminals respectively connected to lines connecting the storage device connector and the host connector with each other and outputs, through the plurality of output terminals, the analysis signal to an outside of the main board.

13. The test board of claim 12, wherein the analysis signal output terminal is configured to output the analysis signal within a predetermined target range.

14. The test board of claim 1, wherein the host connector is configured in a same form factor as the storage device connector, and is configured to be connected to the host.

15. The test board of claim 1, wherein the analysis signal output terminal includes a circuit for preventing power drop or signal loss of the analysis signal.

16. A test board comprising:
a main board;
a storage device connector provided on an upper section of the main board to vertically couple the main board to a storage device;
a host connector provided on a first side section of the main board to horizontally couple the main board to a host;
an analysis signal output terminal provided on the upper section of the main board to output a signal transferred to or from the storage device connector when the storage device is coupled to the storage device connector; and
one or more sub boards each coupled, in series, to each other and to a second side section of the main board,
wherein the sub boards are coupled to be selectively detached according to a form factor of the storage device.

* * * * *